(12) United States Patent
Joshi et al.

(10) Patent No.: US 10,049,879 B2
(45) Date of Patent: Aug. 14, 2018

(54) SELF ALIGNED SILICON CARBIDE CONTACT FORMATION USING PROTECTIVE LAYER

(71) Applicant: Infineon Technologies AG, Neubiberg (DE)

(72) Inventors: Ravi Keshav Joshi, Villach (AT); Romain Esteve, Villach (AT); Markus Kahn, Rangersdorf (AT); Kurt Pekoll, Villach (AT); Juergen Steinbrenner, Noetsch (AT); Gerald Unegg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/582,940

(22) Filed: May 1, 2017

(65) Prior Publication Data

US 2018/0076036 A1    Mar. 15, 2018

Related U.S. Application Data

(63) Continuation of application No. 15/265,081, filed on Sep. 14, 2016, now Pat. No. 9,666,482.

(51) Int. Cl.
| | |
|---|---|
| *H01L 29/15* | (2006.01) |
| *H01L 21/04* | (2006.01) |
| *H01L 29/16* | (2006.01) |
| *H01L 21/324* | (2006.01) |
| *H01L 29/45* | (2006.01) |
| *H01L 21/02* | (2006.01) |

(52) U.S. Cl.
CPC ...... *H01L 21/0485* (2013.01); *H01L 21/0217* (2013.01); *H01L 21/324* (2013.01); *H01L 29/1608* (2013.01); *H01L 29/45* (2013.01)

(58) Field of Classification Search
CPC .......... H01L 21/76897; H01L 21/0485; H01L 21/76805; H01L 21/76889; H01L 29/1095
USPC .......................... 257/77; 438/931, FOR. 260
See application file for complete search history.

(56) References Cited

U.S. PATENT DOCUMENTS

| | | | |
|---|---|---|---|
| 8,101,518 B2 | 1/2012 | Cabral, Jr. et al. | |
| 9,748,342 B2 * | 8/2017 | Oota | H01L 29/1608 |
| 2005/0056839 A1 * | 3/2005 | Tanaka | G02F 1/13458 257/59 |

(Continued)

*Primary Examiner* — Tan N Tran
(74) *Attorney, Agent, or Firm* — Murphy, Bilak & Homiller, PLLC

(57) ABSTRACT

A silicon-carbide substrate that includes: a doped silicon-carbide contact region directly adjoining a main surface of the substrate, and a dielectric layer covering the main surface is provided. A protective layer is formed on the silicon-carbide substrate such that the protective layer covers the dielectric layer and exposes the doped silicon-carbide contact region at the main surface. A metal layer that conforms to the protective layer and directly contacts the exposed doped silicon-carbide contact region is deposited. A first rapid thermal anneal process is performed. A thermal budget of the first rapid thermal anneal process is selected to cause the metal layer to form a silicide with the doped silicon-carbide contact region during the first rapid thermal anneal process without causing the metal layer to form a silicide with the protective layer during the first rapid thermal anneal process.

20 Claims, 10 Drawing Sheets

(56) References Cited

U.S. PATENT DOCUMENTS

2014/0167068 A1* 6/2014 Stum ................... H01L 21/0485
257/77

* cited by examiner

SELF ALIGNED SILICON CARBIDE CONTACT FORMATION USING PROTECTIVE LAYER

PRIORITY CLAIM

This application is a continuation of and claims priority to U.S. patent application Ser. No. 15/265,081 filed on Sep. 14, 2016, the content of said application incorporated herein by reference in its entirety.

TECHNICAL FIELD

The instant application relates to forming contact structures for semiconductor devices, and more particularly relates to forming ohmic contact structures for silicon-carbide semiconductor devices.

BACKGROUND

As silicon is reaching its performance limit, other semiconductor materials are drawing attention as potential device materials for integrated circuits. 4H—SiC (silicon-carbide) materials have a high bandgap and therefore represent one promising alternative to silicon. However, 4H—SiC presents several design challenges. For example, it is difficult to form high performance ohmic contacts on 4H—SiC substrates. No metal has the appropriate work function to form a low-resistance contact with silicon-carbide. Transition metals, such as nickel (Ni), cobalt (Co), iron (Fe), etc., are used to address this issue. These transition metals are deposited on the silicon-carbide surface and annealed in a high temperature (e.g., ≥800° C.) process. The high temperature annealing forms a metal-silicide along with a layer of carbon on the substrate. The carbon layer has a decreased work function and thus provides a tunneling Ohmic contact.

One challenge associated with using transition metals relates to the structuring of these metals to form the contact structure in the intended location. Lift-off techniques can be used to structure the transmission metals. According to a lift-off technique, a dissolvable mask (e.g., a photoresist mask) is formed on the substrate and structured so that the openings in the mask correspond to the desired contact location. A layer of the transition metal is deposited on the substrate so as to conform to the mask. The mask is then dissolved, thereby removing the portions of the metal layer that adhere to the mask.

The above described lift-off technique has notable drawbacks. For example, it is difficult to precisely control the removal of the transition metal layer along a defined boundary. In many cases, a small amount of metal remains present after the lift-off process is performed. This metal can contaminate devices regions, such as the gate oxide. This problem is particularly pronounced in smaller cell pitch devices. As a result, these devices suffer from higher defect density. In sum, lift-off techniques negatively impact manufacturing yield for SiC based devices.

SUMMARY

A method of forming a contact structure for a semiconductor device is disclosed. According to an embodiment of the method, a silicon-carbide substrate that includes: a doped silicon-carbide contact region directly adjoining a main surface of the substrate, and a dielectric layer covering the main surface is provided. A protective layer is formed on the silicon-carbide substrate such that the protective layer covers the dielectric layer and exposes the doped silicon-carbide contact region at the main surface. A metal layer that conforms to the protective layer and directly contacts the exposed doped silicon-carbide contact region is deposited. A first rapid thermal anneal process is performed. A thermal budget of the first rapid thermal anneal process is selected to cause the metal layer to form a silicide with the doped silicon-carbide contact region during the first rapid thermal anneal process without causing the metal layer to form a silicide with the protective layer during the first rapid thermal anneal process.

A method of forming a silicide on a semiconductor substrate is disclosed. According to an embodiment of the method, a silicon-carbide substrate that includes: a doped silicon-carbide contact region directly adjoining a main surface of the substrate, and a protective layer that exposes the doped silicon-carbide contact region and covers portions of the main surface that are laterally adjacent to the exposed doped silicon-carbide contact region is provided. A metal layer that directly contacts the doped silicon-carbide contact region at the main surface and covers the protective layer is formed. A first rapid thermal anneal process is performed. A thermal budget of the first rapid thermal anneal process is selected to cause the metal layer to form a silicide with the doped silicon-carbide contact region during the first rapid thermal anneal process without causing the metal layer to form a silicide with the protective layer during the first rapid thermal anneal process.

According to another embodiment of the method of forming a silicide on a semiconductor substrate, a silicon-carbide substrate that includes: a doped silicon-carbide contact region directly adjoining a main surface of the substrate, and a protective layer that exposes the doped silicon-carbide contact region and covers portions of the main surface that are laterally adjacent to the exposed doped silicon-carbide contact region is provided. A metal layer that directly contacts the doped silicon-carbide contact region at the main surface and directly contacts the protective layer is formed. A first rapid thermal anneal process is performed. A second rapid thermal anneal process is performed after performing the first rapid thermal anneal process. The first rapid thermal anneal process causes the metal layer that directly contacts the doped silicon-carbide contact region to partially silicidize. The second rapid thermal anneal process causes the metal layer that directly contacts the doped silicon-carbide contact region to completely silicidize.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The methods described herein advantageously form a self-aligned low-ohmic silicon-carbide contact structure without using a conventional lift-off technique. The inventors have discovered that by using a protective layer with certain silicidization properties and by appropriately selecting the thermal budget of a preliminary rapid thermal anneal process, it is possible to selectively remove portions of a transition metal layer. For example, according to one embodiment, a layer of silicon nitride (SiN) is deposited over a dielectric layer of silicon dioxide ($SiO_2$). A transition metal layer (e.g., Nickel Aluminum (NiAl)) is formed on the substrate so as to directly contact silicon-carbide substrate contact regions and cover the protective layer outside of the contact regions. A low thermal budget rapid thermal anneal process (e.g., 750° Celsius for two minutes) is performed. During the low thermal budget rapid thermal anneal process, the transition metal layer forms a silicide with the silicon-carbide substrate contact regions, but does not form a silicide with the protective layer, and does not contaminate the subjacent dielectric layer. Subsequently, the non-silicidized portions of the metal layer can be etched away selective to the metal-silicide.

Figure 1:
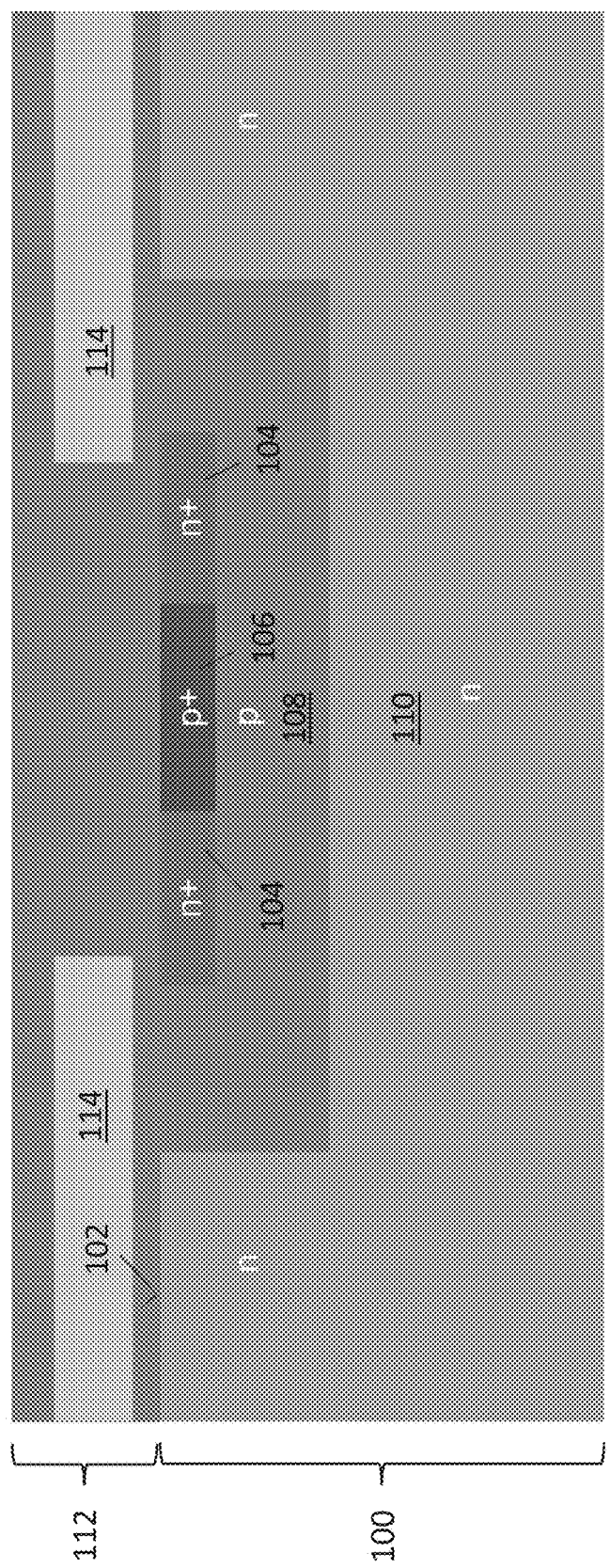
FIG. 1 illustrates a silicon-carbide substrate that includes a doped silicon-carbide contact region and a dielectric layer, according to an embodiment.

Referring to FIG. 1, a substrate 100 is provided. The substrate 100 may be formed from silicon-carbide (SiC), and in particular may be formed from a 4H—SiC crystalline silicon-carbide material. This substrate 100 can be a bulk semiconductor or alternatively can be an epitaxially grown layer. The substrate 100 has a main surface 102 that extends between lateral edge sides.

The substrate 100 includes doped device regions that correspond to the device regions of a vertical DMOSFET (double-diffused metal oxide semiconductor field-effect-transistor). In particular, the substrate 100 includes highly doped first conductivity type (e.g., n-type) source regions 104, a highly doped second conductivity type (e.g., p-type) base contact region 106, a second conductivity type base region 108, and a drift region 110. The source regions 104 and the base contact region 106 each directly adjoin the main surface 102 of the substrate 100. The source regions 104 and the base contact region 106 can have a doping concentration on the order of $10^{17}$ cm$^{-3}$ and 1020 cm$^{-3}$. The base region 108 and the drift region 110 can have a doping concentration on the order of order of $10^{13}$ cm$^{-3}$ and $10^{17}$ cm$^{-3}$.

A dielectric layer 112 is formed on the substrate 100. The dielectric layer 112 may be a layer of oxide, such as silicon dioxide ($SiO_2$) A gate electrode 114 is formed in the dielectric layer 112. The gate electrode 114 may be formed from any electrically conductive material including polysilicon or tungsten (W), for example. The gate electrode 114 is spaced apart from the substrate 100 and is configured to form an electrically conductive channel in the base region 108 in a conventionally known manner.

Figure 2:
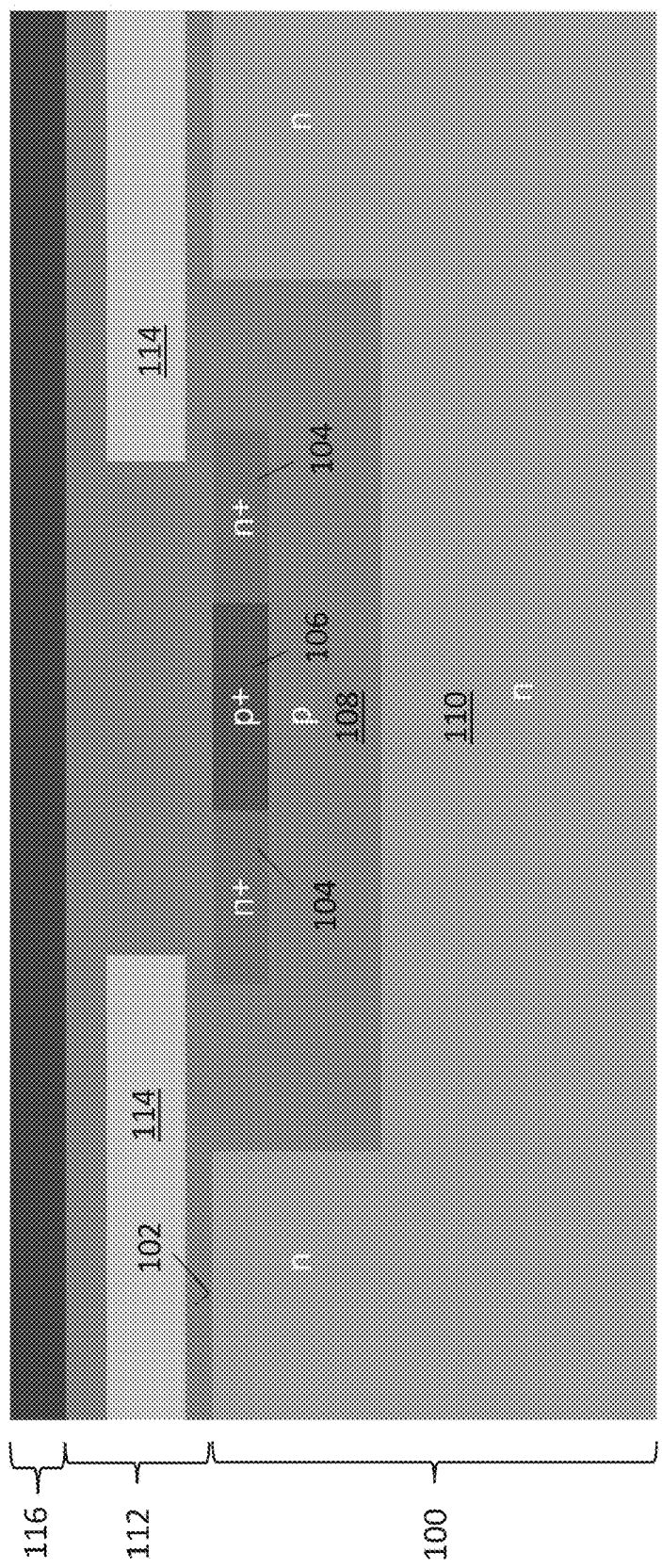
FIG. 2 illustrates forming a protective layer on the dielectric layer, according to an embodiment.

Referring to FIG. 2, a protective layer 116 is formed on the substrate 100 over the dielectric layer 112. The protective layer 116 may be formed directly on the dielectric layer 112. Alternatively, one or more intermediate layers may be formed between the dielectric layer 112 and the protective layer 116. Exemplary materials for the protective layer 116 include nitride materials such as silicon nitride (SiN), titanium nitride (TiN), tantalum nitride (TaN), tungsten nitride (WN), oxides such as zirconium dioxide ($ZrO_2$) Hafnium oxide ($HFO_2$), and amorphous carbon (C). The protective layer 116 can have a thickness in the range of 50 nm and 200 nm. The protective layer 116 can be formed by a deposition process, such as a chemical vapor deposition (CVD) process, for example.

Figure 3:
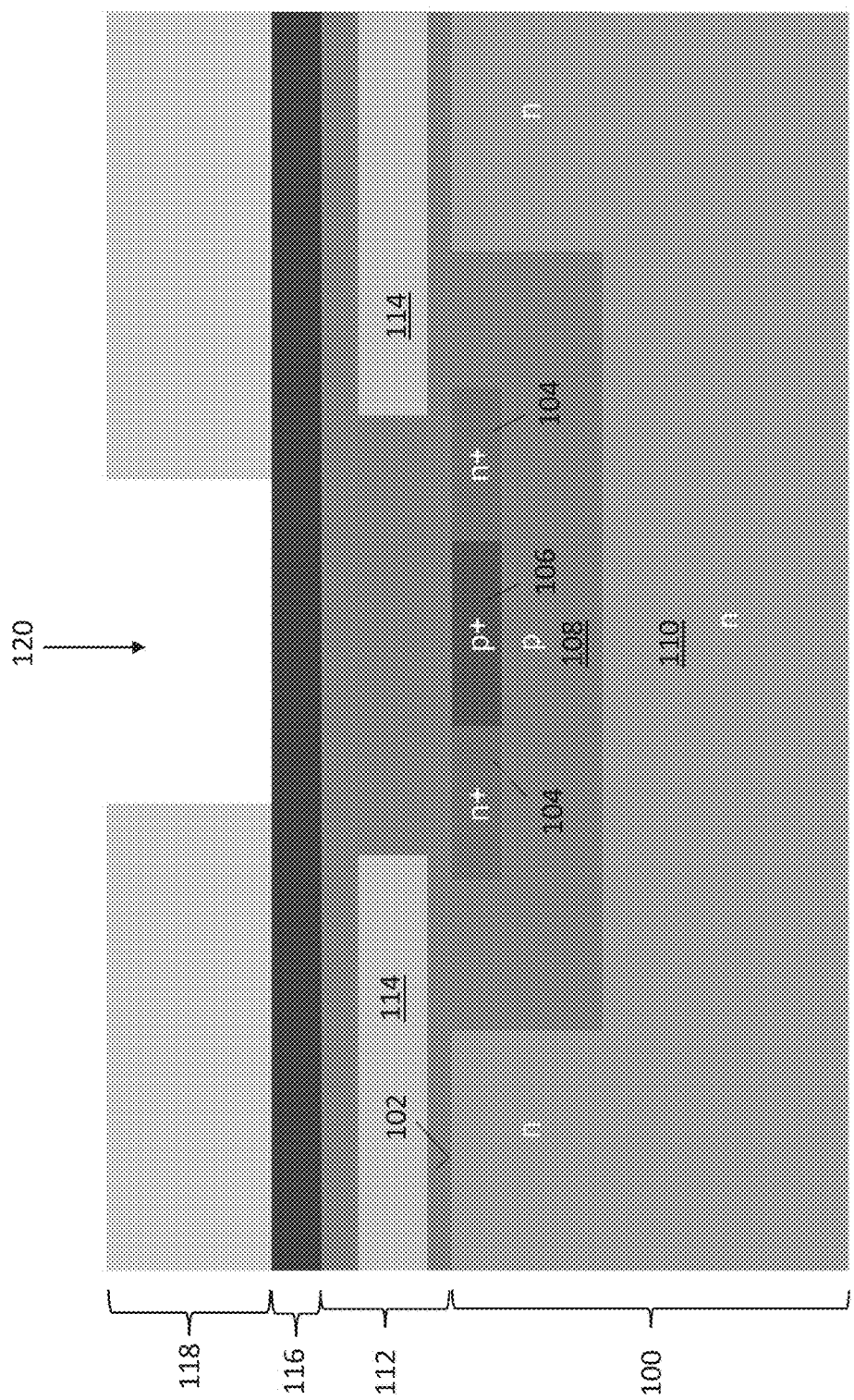
FIG. 3 illustrates forming a structured mask on the protective layer, according to an embodiment.

Referring to FIG. 3, a structured mask 118 is formed on the protective layer 116. The structured mask 118 may be a photomask that is patterned according to known photolithography techniques. The structured mask 118 has been patterned to include an opening 120 that is aligned with a contact region of the substrate 100. In particular, the opening 120 is aligned with the base contact region 106. Aligned with refers to the fact that the opening 120 is disposed directly above the base contact region 106 and is at least as wide as the base contact region 106. Optionally, the opening 120 may be wider than the contact region to which it is aligned with. In the example of FIG. 3, the opening 120 is wider than the base contact region 106 so as to partially extend over the source regions 104.

Figure 4:
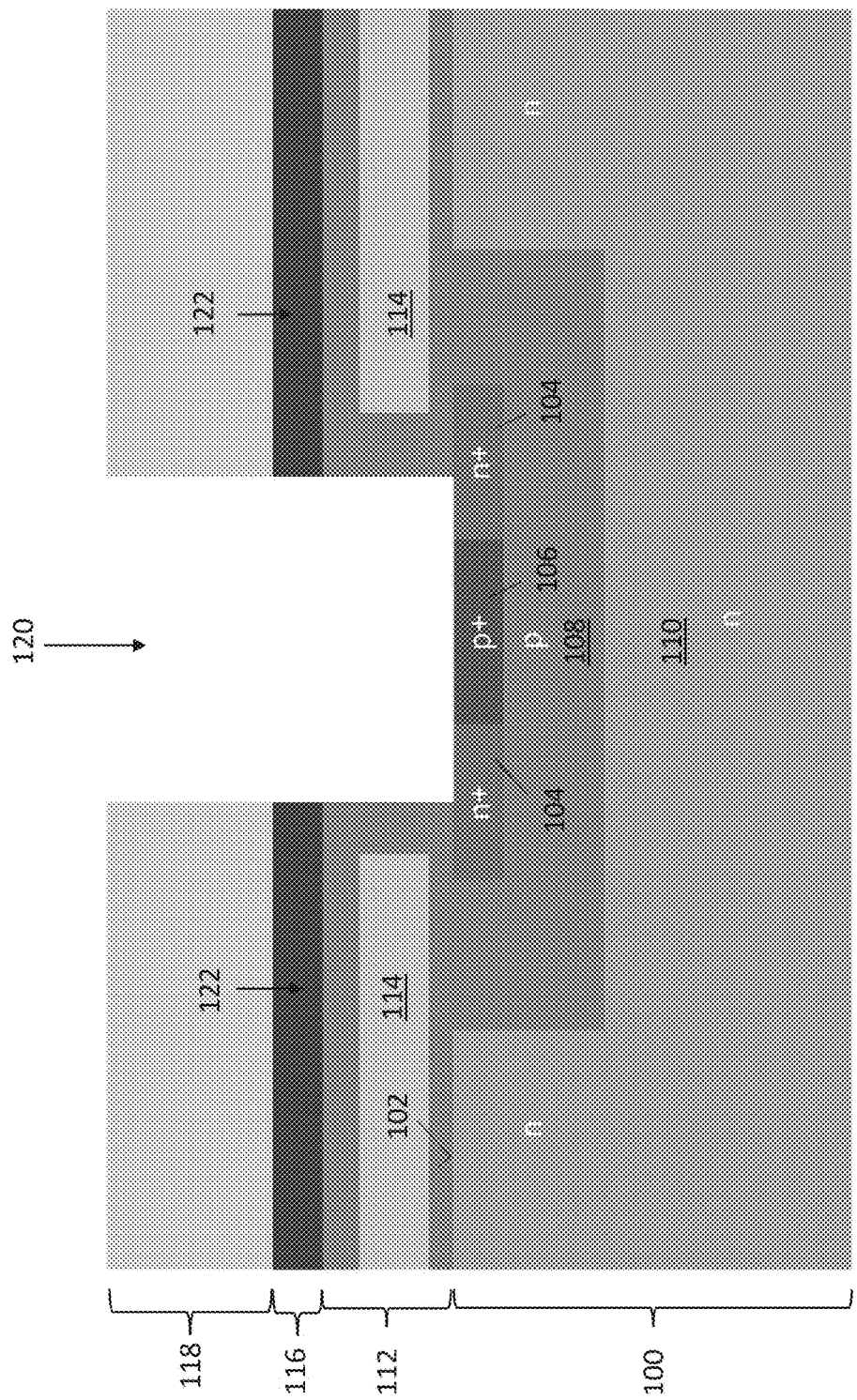
FIG. 4 illustrates etching both the protective layer and the dielectric layer so as to expose the doped silicon-carbide contact region, according to an embodiment.

Referring to FIG. 4, a section of the protective layer 116 that is exposed by the opening 120 is removed and a subjacent section of the dielectric layer 112 that is exposed by the opening 120 is removed. Meanwhile, sections of the protective layer 116 and the dielectric layer 112 that are covered by the structured mask 118 remain on the substrate 100. Removing the sections of the protective layer 116 and the dielectric layer 112 can be done using chemical etch in which an etchant reacts with the material in the openings 120, and the structured mask 118 protects the material disposed underneath the structured mask 118 from reacting with the etchant. According to an embodiment, the protective layer 116 and the dielectric layer 112 are etched using an isotropic etching process. Alternatively, the etching process can be an anisotropic process whereby some of the material that is directly underneath the structured mask 118 is also removed. For example, an anisotropic process can be used to form a taper in the remaining sections of the protective layer 116 and the dielectric layer 112 such that the dielectric layer 112 laterally shrinks as it approaches the substrate 100. Such a process and structure is not compatible with a conventional lift-off process because the tapered dielectric sidewall is not conducive to removal of lift off material from the sidewalls of the dielectric layer 112. Thus, anisotropic etching offers an additional degree of flexibility with respect to the shape and structure of the dielectric layer 112, which is used as the gate dielectric in the DMOS embodiments described herein.

As a result of the removal step of FIG. 4, the base contact region 106 is completely exposed and the source regions 104 are partially exposed. Moreover, structured regions 122 that are laterally adjacent to the base contact region 106 and the exposed portions of the source regions 104 remain on the substrate 100. These structured regions 122 include sections of the dielectric layer 112 and the protective layer 116.

Figure 5:
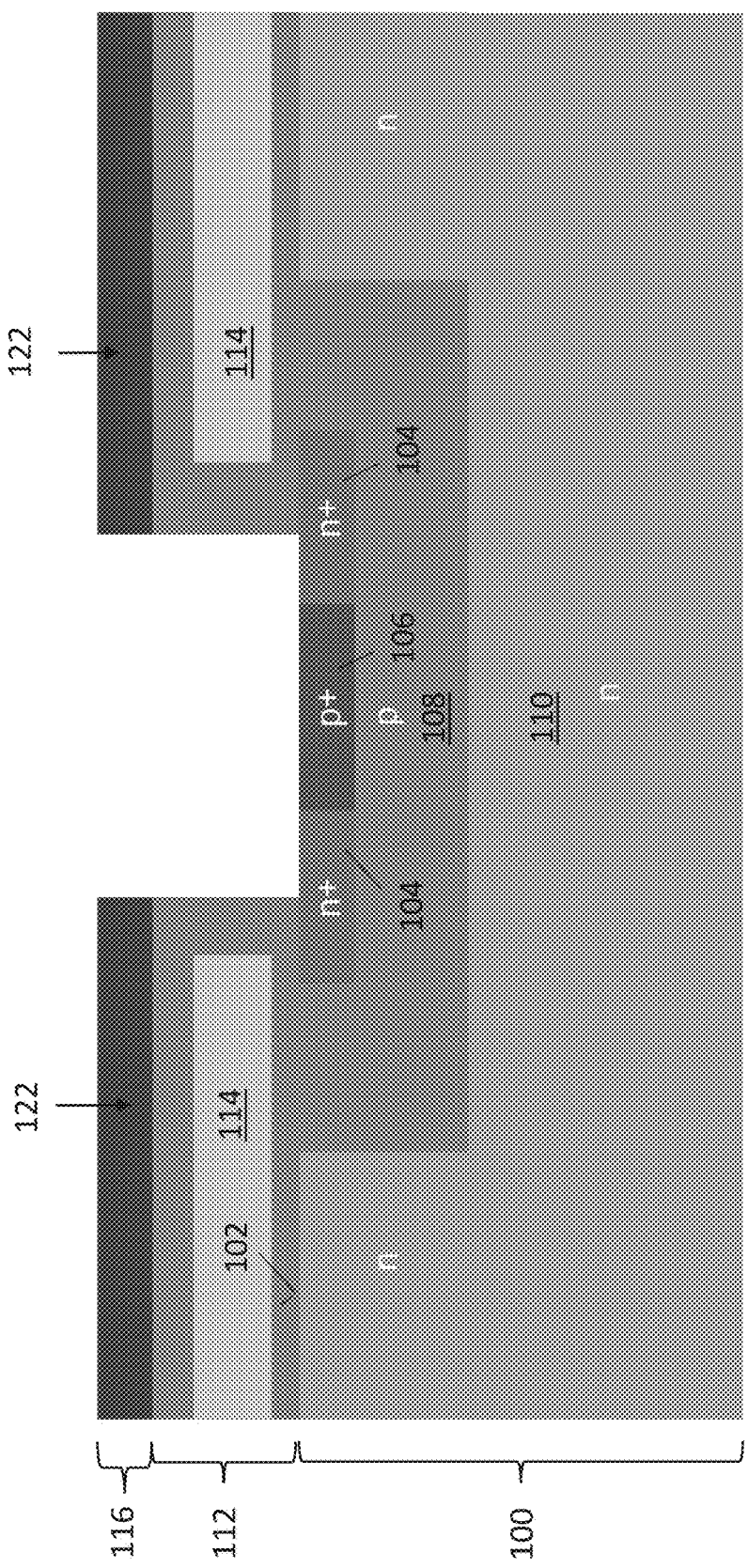
FIG. 5 illustrates removing the structured mask, according to an embodiment.

Referring to FIG. 5, the structured mask 118 is removed from the substrate 100. This can be done using a chemical cleaning process. Any commonly known wet or dry etching process can be used to remove the structured mask 118.

Figure 6:
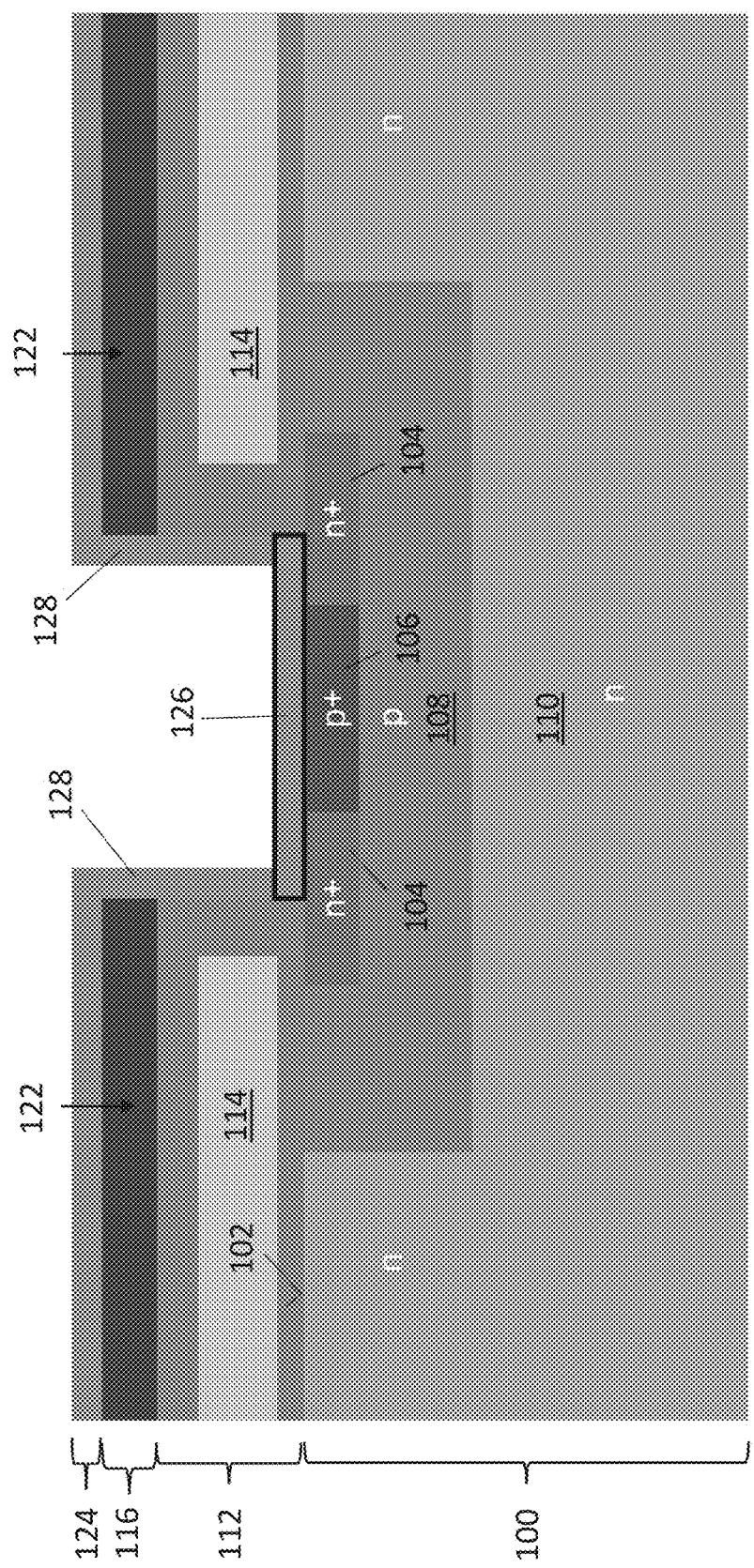
FIG. 6 illustrates depositing a metal layer that covers the protective layer and directly contacts the doped silicon-carbide contact region, according to an embodiment.

Referring to FIG. 6, a metal layer 124 is formed along the substrate 100. The metal layer 124 is a conformal layer that lines the structured regions 122 and the exposed portion of the substrate 100 that is between the structured regions 122. A first portion 126 of the metal layer 124 directly contacts the exposed portion of the main surface 102 that includes the base contact region 106 and part of the source regions 104. A second portion 128 of the metal layer 124 directly contacts the structured regions 122, i.e., the remaining sections of the protective layer 116 and the dielectric layer 112. The metal layer 124 can be formed by a sputtering technique, for example.

The metal layer 124 can include a transition metal that is suitable for silicidization with the substrate 100. Examples of these metals include nickel (Ni), cobalt (Co), iron (Fe), aluminum (Al) and alloys thereof. According to an embodiment, the metal layer 124 is a layer of nickel aluminum (NiAl) that is formed by sputtering.

Figure 7:
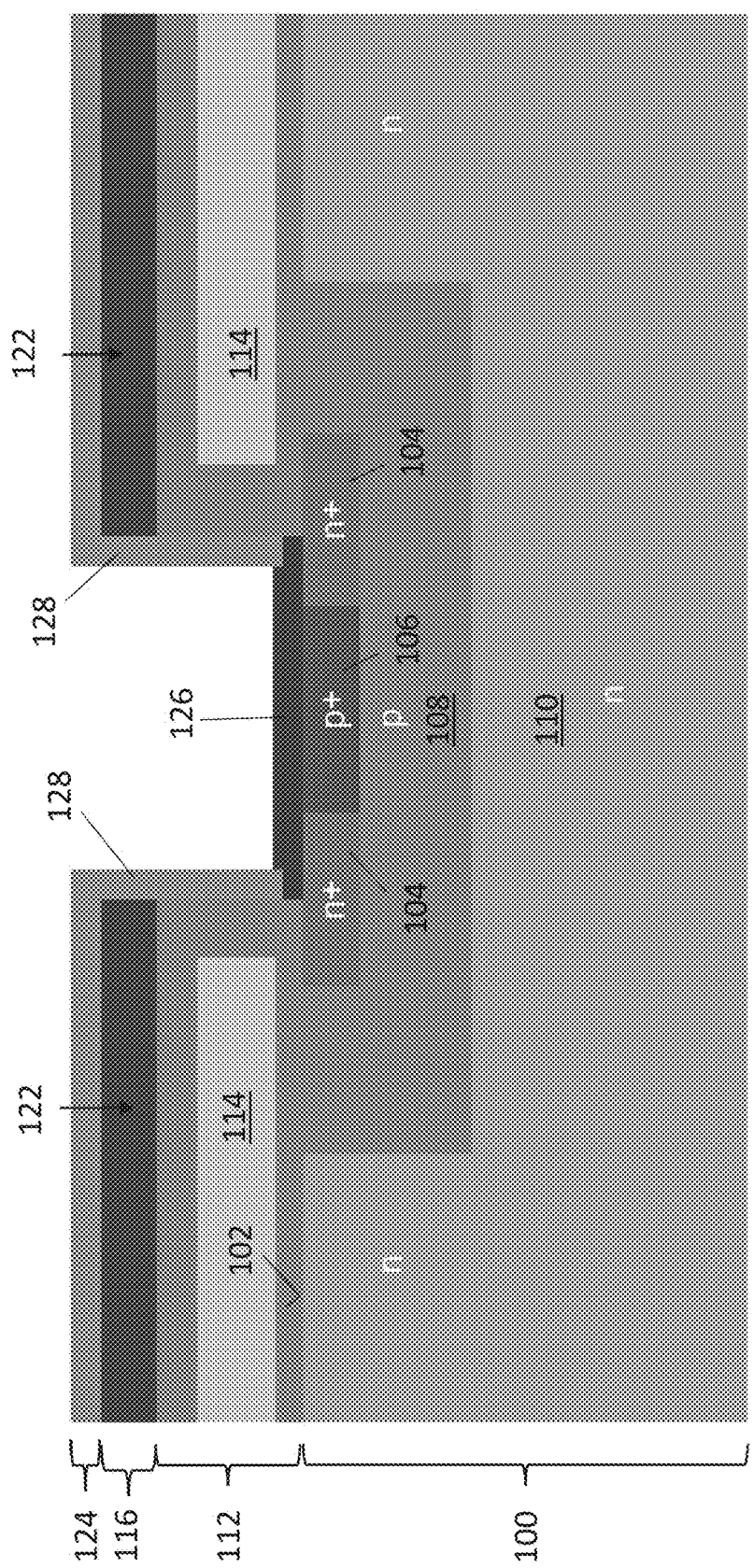
FIG. 7 illustrates performing a presilicidization rapid thermal anneal process, according to an embodiment.

Referring to FIG. 7, a first rapid thermal anneal process is performed. The first rapid thermal anneal process is performed by exposing the substrate 100 to elevated temperatures for a fixed duration. The first rapid thermal anneal process causes the first portion 126 of the metal layer 124 to form a silicide with the substrate 100. More particularly, a metal-silicide forms at an interface between the first portion 126 of the metal layer 124 and both the base contact region 106 and parts of the source regions 104.

Meanwhile, the second portion 128 of the metal layer 124 partially dissolves into the protective layer 116. However, due to the material properties of the protective layer 116, no silicidization occurs between the second portion 128 of the metal layer 124 and the protective layer 116 during the first rapid thermal anneal. Moreover, the dielectric layer 112 present in the structured regions 122 is not contaminated by the metal from the second portion 128 of the metal layer 124.

The inventors have determined that various process parameters can be selected to bring about the above described result in which the first portion 126 of the metal layer 124 forms a silicide with the doped silicon-carbide contact region during the first rapid thermal anneal process without causing the second portion 128 of the metal layer 124 to form a silicide with the remaining section of the protective layer 116. Examples of these process parameters include: material composition of the protective layer 116, thickness of the protective layer 116, material composition of the metal layer 124, and thermal budget (i.e., time and temperature) of the first rapid thermal anneal process.

Generally speaking, the material composition of the protective layer 116 is selected to prevent silicidization between the metal layer 124 and the protective layer 116 at temperatures at which silicidization between the metal layer 124 and the substrate 100 will occur. Examples of materials for the protective layer 116 that produce this result include silicon nitride (SiN), titanium nitride (TiN) and amorphous carbon (C). The thickness of the protective layer 116 is selected to prevent contamination of the dielectric layer 112 by the second portion 128 of the metal layer 124 during the first rapid thermal anneal process. Exemplary thicknesses that produce this result include thicknesses between 50 nm and 200 nm. The material composition of the metal layer 124 is selected to produce a metal-silicide between the metal layer 124 and the substrate 100 during a low thermal budget (e.g., less than 1000° Celsius and less than four minutes) rapid thermal anneal process. Examples metals that produce this result include nickel (Ni), cobalt (Co), iron (Fe), aluminum (Al) and alloys thereof. The thermal budget of the first rapid thermal anneal process is selected to cause the first portion 126 of the metal layer 124 to form a silicide with the material of the substrate 100 without causing the second portion 128 of the metal layer 124 to form a silicide with the material of the protective layer 116. An exemplary thermal budget that meets this criterion is a temperature of between 600° Celsius and 800° Celsius for a duration of no more than two minutes.

According to one embodiment, the protective layer 116 is selected to be a 100 nm thick layer of silicon nitride (SiN) and the metal layer 124 is selected to be layer of nickel aluminum (NiAl). The inventors have determined that, for these parameters, the first thermal anneal process can be carried out at a temperature of about 750° Celsius for a duration two minutes to achieve the desired result of partial silicidization with the substrate and no contamination with the dielectric. When the temperatures reach or exceed 800° and the other process parameters remain the same, the inventors have observed that the dielectric layer 112 becomes contaminated by the second portion 128 of the metal layer 124 that is formed over the structured regions 122. However, at a temperature of about 750° Celsius for a duration two minutes, the first portion 126 of the metal layer 124 forms a silicide with the substrate 100 and the second portion 128 of the metal layer 124 does not contaminate the dielectric layer 112

Changing one or more of the above described parameters may require adjustment to other parameters to obtain the desired result of partial silicidization with the substrate and no contamination with the dielectric. For example, if the protective layer 116 is selected to be a different material, such as titanium nitride or amorphous carbon, the thermal budget of the first rapid thermal anneal process can be adjusted accordingly to ensure that the first portion 126 of the metal layer 124 forms a silicide with the substrate 100 while the second portion 128 of the metal layer 124 does not contaminate the dielectric layer 112.

Figure 8:
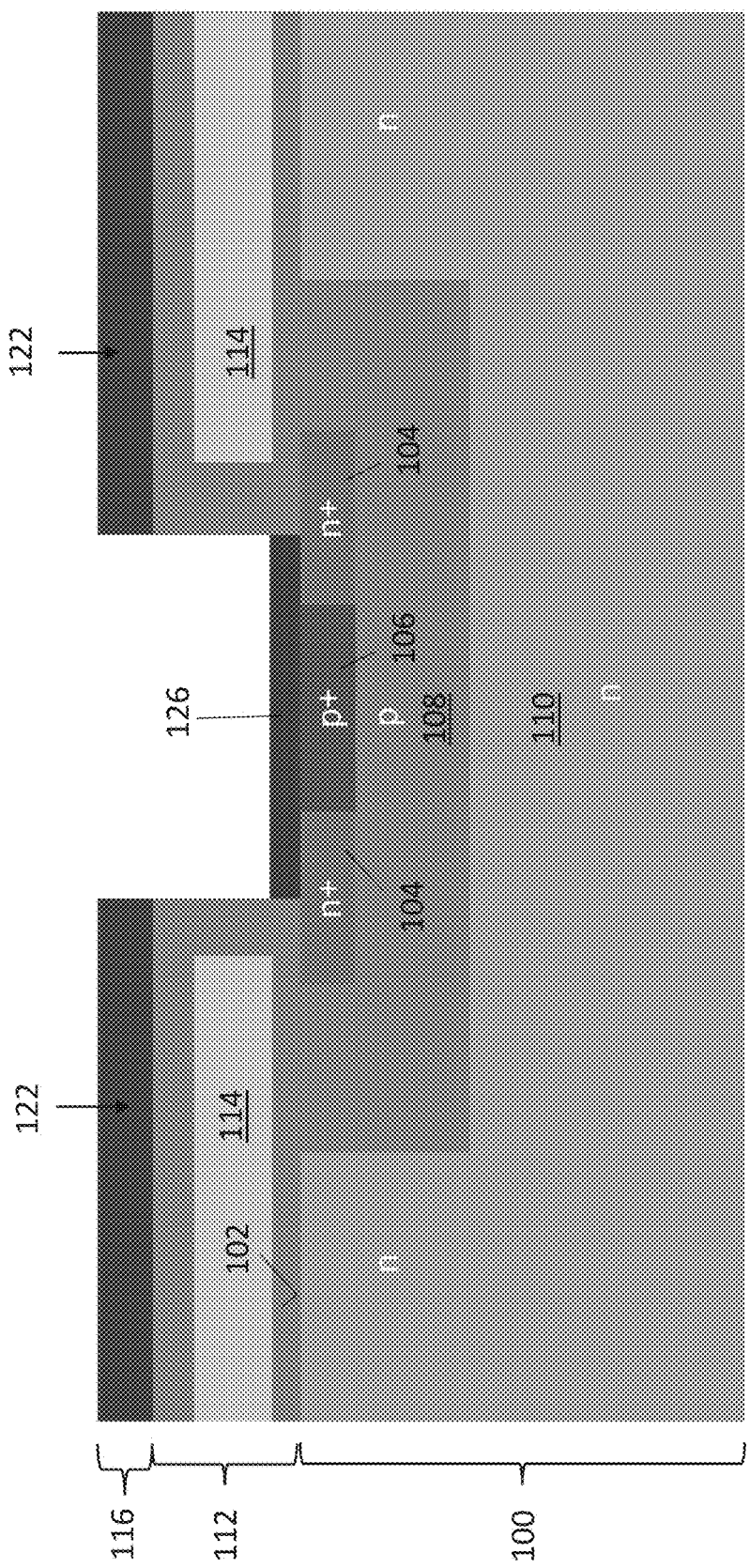
FIG. 8 illustrates selectively removing portions of the metal layer that are disposed outside of the doped silicon-carbide contact region, according to an embodiment.

Referring to FIG. 8, the second portion 128 of the metal layer 124 is removed selective to the first portion 126 of the metal layer 124. After the first rapid thermal anneal process, the metal-silicide that forms between the first portion 126 of the metal layer 124 and the substrate 100 does not respond to chemical etching. That is, it is difficult or impossible to remove the metal-silicide. By contrast, the non-silicidized metal that is present over the structured regions 122 can be removed by chemical etching. That is, due to the first rapid thermal anneal process, it is possible to etch the metal layer 124 selective to metal-silicide. More particularly, a hot phosphoric acid solution can be used to remove the second portion 128 of the metal layer 124 without removing the first portion 126 of the metal layer 124.

Figure 9:
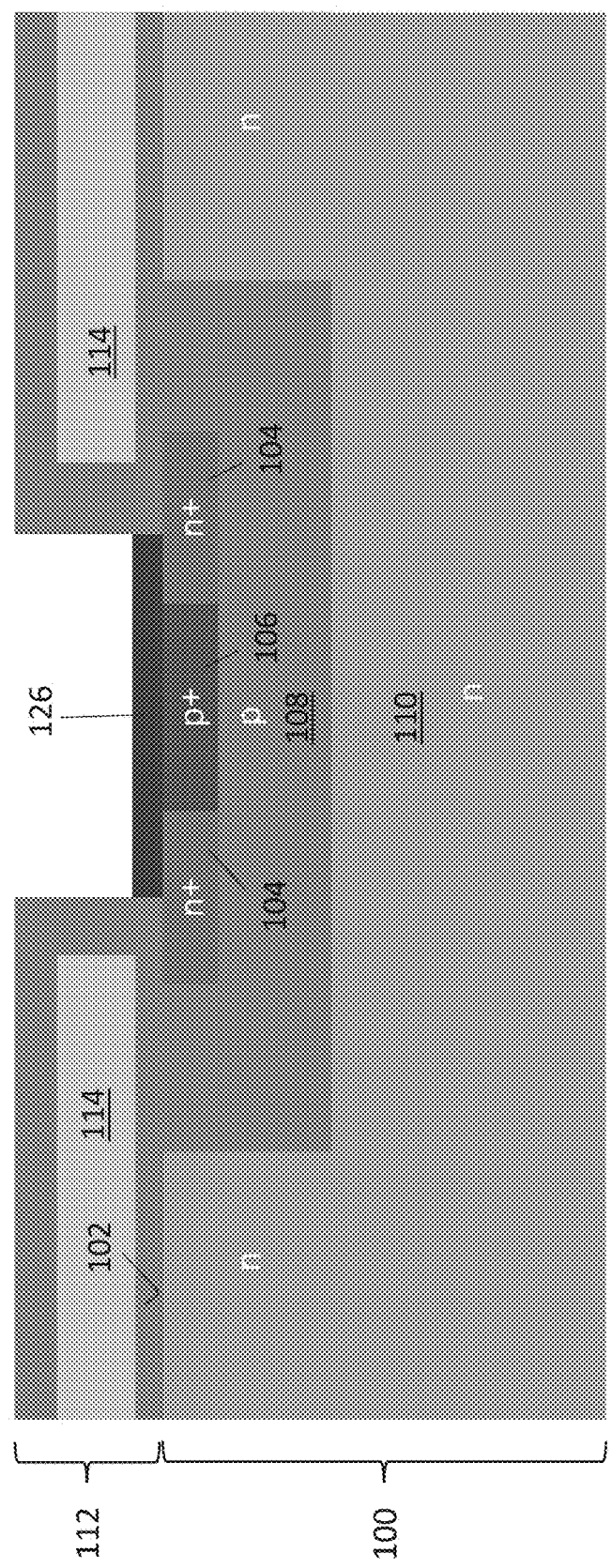
FIG. 9 illustrates selectively removing portions of the protective layer, according to an embodiment.

Referring to FIG. 9, the protective layer 116 is removed from the structured regions 122. This can be done by an etching process that removes the material of the protective layer 116 selective to metal-silicide. According to an embodiment, the protective layer 116 is removed by a hot phosphoric acid solution.

Figure 10:
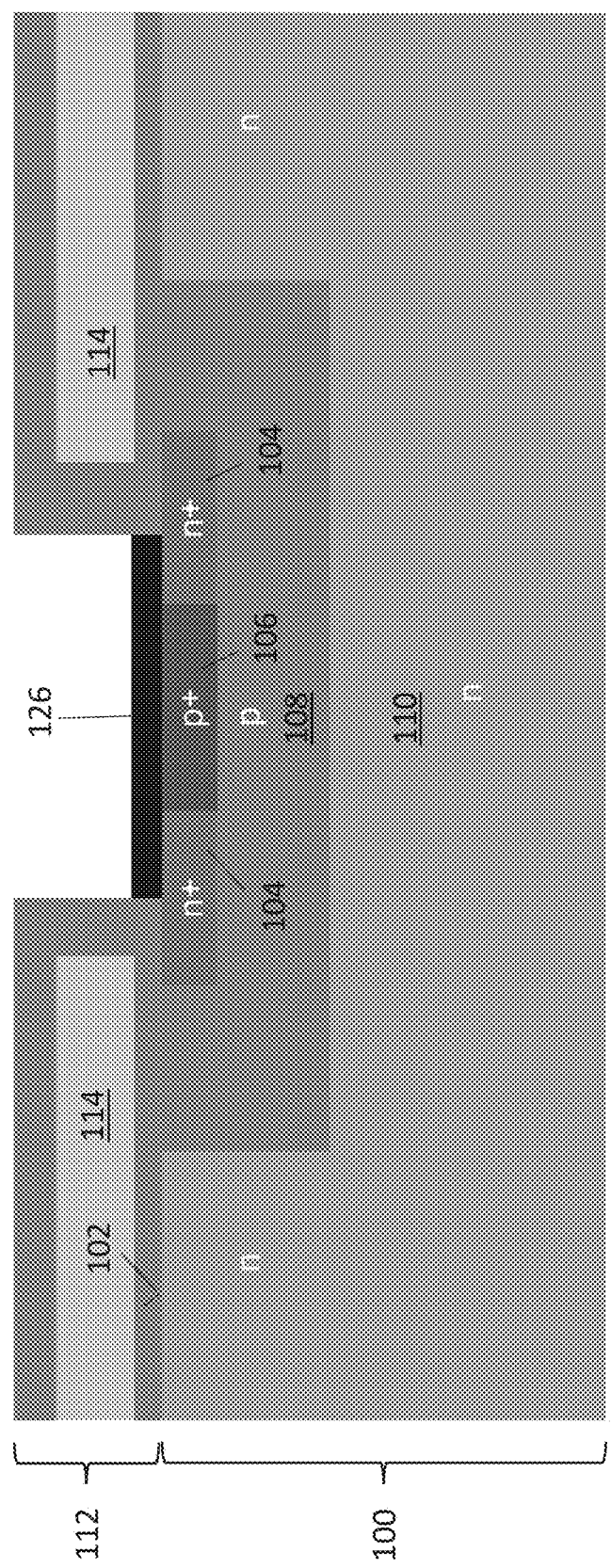
FIG. 10 illustrates performing a second rapid thermal anneal process, according to an embodiment.

Referring to FIG. 10, a second thermal anneal process is performed. The second thermal anneal process can have a higher thermal budget than the first thermal anneal process. For example, the second rapid thermal anneal process can be performed by exposing the substrate 100 to a temperature of greater than 950° Celsius, such as 1000° Celsius, for a time period of greater than two minutes, such as four minutes. According to another embodiment, the second thermal anneal process is performed at the same temperature as the first thermal anneal process but with a different ambient atmosphere. As a result of the second thermal anneal process, the source regions 104 and the base contact region 106 are in ohmic contact with the first portion 126 of the metal layer 124.

According to another embodiment, the second thermal anneal process can be omitted if the material composition of the protective layer 116 is selected to be sufficiently stable and unreactive with the metal layer 124 at high temperatures at which silicidization between the metal layer 124 and the substrate 100 occurs. For example, in the case of the an NiAl metal layer 124, if the protective layer 116 is sufficiently stable to withstand siliziization temperatures of greater than 950° Celsius, such as 1000° Celsius, the first rapid thermal anneal process can be carried out at this temperature such that the first portion 126 of the metal layer 124 fully silicidizes with the source regions 104 during the first rapid thermal anneal process.

The above described embodiments use a vertical DMOSFET as an exemplary SiC based device with ohmic contacts that are formed according to the techniques described herein. However, the techniques described herein are not limited to this structure, and are instead applicable to a wide variety of SiC device types. Exemplary device types include JFETs, MOSFETs, diodes, vertical devices, lateral devices, etc. The embodiments described herein can be used to form an ohmic contact for any one of these different SiC device types.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the conductivity type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

In the context of the present disclosure, the term "ohmic" refers to a contact having an approximately constant ratio of voltage/current that does not depend from the polarity of the applied voltage. The term "ohmic contact" also encompasses contacts having a voltage/current characteristic which is not strictly linear but includes minor non-linearities.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a contact structure for a semiconductor device, comprising:
   providing a silicon-carbide substrate that comprises: a doped silicon-carbide contact region directly adjoining a main surface of the substrate, and a dielectric layer covering the main surface;
   forming a protective layer on the silicon-carbide substrate such that the protective layer covers an exposed upper side of the dielectric layer that is opposite the main surface and such that the protective layer directly contacts a majority of the exposed upper side, and exposes the doped silicon-carbide contact region at the main surface;
   depositing a metal layer that conforms to the protective layer and directly contacts the exposed doped silicon-carbide contact region; and
   performing a first rapid thermal anneal process,
   wherein a thermal budget of the first rapid thermal anneal process is selected to cause the metal layer to form a silicide with the doped silicon-carbide contact region during the first rapid thermal anneal process without causing the metal layer to form a silicide with the protective layer during the first rapid thermal anneal process.

2. The method of claim 1, wherein selecting the thermal budget of the first rapid thermal anneal process comprises setting a time and temperature of the first rapid thermal anneal process based upon at least one of: a material composition of the protective layer, a thickness of the protective layer, and a material composition of the metal layer.

3. The method of claim 2, wherein the protective layer is a layer of silicon nitride (SiN), wherein the time and temperature of the first rapid thermal anneal process is set to be less than 800° Celsius for no more than two minutes.

4. The method of claim 3, wherein the protective layer is approximately 100 nm thick, and wherein the temperature of the first rapid thermal anneal process is set to be approximately 750° Celsius.

5. The method of claim 1, further comprising:
   removing non-silicidized portions of the metal layer after performing the first rapid thermal anneal; and
   performing a second rapid thermal anneal process after removing the non-silicidized portions of the metal layer whereby a remaining portion of the metal layer further silicidizes with the doped silicon-carbide contact region.

6. The method of claim 5, wherein a thermal budget of the second rapid thermal anneal process is greater than a thermal budget of the first rapid thermal anneal process.

7. The method of claim 6, wherein the thermal budget of the first rapid thermal anneal process is a temperature of 750° Celsius for no more than two minutes and wherein the thermal budget of the second rapid thermal anneal process is a temperature of 1000° Celsius for no more than four minutes.

8. The method of claim 1, wherein the portion of the metal layer that directly contacts the doped silicon-carbide contact region fully silicidizes with the doped silicon-carbide contact region during the first rapid thermal anneal process.

9. The method of claim 1, wherein the protective layer completely covers the exposed upper side of the dielectric layer that is opposite the main surface.

10. A method of forming a silicide on a semiconductor substrate, the method comprising:
providing a silicon-carbide substrate that comprises: a doped silicon-carbide contact region directly adjoining a main surface of the substrate;
forming a dielectric layer on the main surface;
forming a protective layer on an exposed upper side of the dielectric layer that is opposite the main surface immediately after forming the dielectric layer forming an opening in the dielectric layer and the protective layer such that the protective layer and the dielectric layer expose the doped silicon-carbide contact region and cover portions of the main surface that are laterally adjacent to the exposed doped silicon-carbide contact region;
forming a metal layer that directly contacts the doped silicon-carbide contact region at the main surface and covers the protective layer; and
performing a first rapid thermal anneal process,
wherein a thermal budget of the first rapid thermal anneal process is selected to cause the metal layer to form a silicide with the doped silicon-carbide contact region during the first rapid thermal anneal process without causing the metal layer to form a silicide with the protective layer during the first rapid thermal anneal process.

11. The method of claim 10, wherein the dielectric layer surrounds a gate electrode with a lower region of the dielectric layer disposed between the gate electrode and the main surface and an upper region of the dielectric layer disposed over the gate electrode opposite the lower region.

12. The method of claim 10, wherein selecting the thermal budget of the first rapid thermal anneal process comprises setting a time and temperature of the first rapid thermal anneal process based upon at least one of: a material composition of the protective layer, a thickness of the protective layer, and a material composition of the metal layer.

13. The method of claim 12, wherein the protective layer is a layer of silicon nitride (SiN), wherein the time and temperature of the first rapid thermal anneal process is selected to be less than 800° Celsius for no more than two minutes.

14. The method of claim 13, wherein the protective layer is approximately 100 nm thick, and wherein the temperature of the first rapid thermal anneal process is selected to be approximately 750° Celsius.

15. The method of claim 10, further comprising:
removing non-silicidized portions of the metal layer after performing the first rapid thermal anneal; and
performing a second rapid thermal anneal process after removing the non-silicidized portions of the metal layer whereby a remaining portion of the metal layer further silicidizes with the doped silicon-carbide contact region.

16. The method of claim 15, wherein a thermal budget of the second rapid thermal anneal process is greater than a thermal budget of the first rapid thermal anneal process.

17. The method of claim 16, wherein the thermal budget of the first rapid thermal anneal process is a temperature of 750° Celsius for no more than two minutes and wherein the thermal budget of the first rapid thermal anneal process is a temperature of 1000° Celsius for no more than four minutes.

18. The method of claim 10, wherein the metal layer that directly contacts the doped silicon-carbide contact region fully silicidizes with the doped silicon-carbide contact region during the first rapid thermal anneal process.

19. A method of forming a silicide on a semiconductor substrate, the method comprising:
providing a silicon-carbide substrate that comprises: a doped silicon-carbide contact region directly adjoining a main surface of the substrate;
forming a dielectric layer on the main surface;
forming a protective layer on an exposed upper side of the dielectric layer that is opposite the main surface immediately after forming the dielectric layer;
forming an opening in the dielectric layer and the protective layer such that the protective layer and the dielectric layer expose the doped silicon-carbide contact region and cover portions of the main surface that are laterally adjacent to the exposed doped silicon-carbide contact region;
forming a metal layer that directly contacts the doped silicon-carbide contact region at the main surface and directly contacts the protective layer; and
performing a first rapid thermal anneal process; and
performing a second rapid thermal anneal process after performing the first rapid thermal anneal process,
wherein the first rapid thermal anneal process causes the metal layer that directly contacts the doped silicon-carbide contact region to partially silicidize, and
wherein the second rapid thermal anneal process causes the metal layer that directly contacts the doped silicon-carbide contact region to completely silicidize.

20. The method of claim 19, wherein the first rapid thermal anneal process does not cause the metal layer that directly contacts the protective layer to silicidize.

* * * * *